United States Patent [19]

Jarrett

[11] Patent Number: 4,595,909
[45] Date of Patent: Jun. 17, 1986

[54] N-BIT PROPAGATARY ANALOG-TO-DIGITAL CONVERTER SYSTEM

[75] Inventor: Bobby R. Jarrett, Fredericksburg, Va.

[73] Assignee: The United States of America as represented by the Secretary of the Navy, Washington, D.C.

[21] Appl. No.: 324,895

[22] Filed: Nov. 25, 1981

[51] Int. Cl.⁴ .......................................... H03K 13/08
[52] U.S. Cl. ...................... 340/347 AD; 340/347 M; 357/24
[58] Field of Search .... 340/347 M, 347 AD, 347 CC; 357/24

[56] References Cited

U.S. PATENT DOCUMENTS

| | | | |
|---|---|---|---|
| 3,100,298 | 8/1963 | Fluhr | 340/347 M X |
| 3,156,913 | 11/1964 | Crocker et al. | 340/347 M X |
| 4,375,059 | 2/1983 | Schlig | 340/347 AD |

*Primary Examiner*—T. J. Sloyan
*Attorney, Agent, or Firm*—Robert F. Beers; Kenneth E. Walden; John G. Wynn

[57] ABSTRACT

The application of peristaltic charge-coupled-devices to an analog delay line provides an ultra high speed n-bit propagatory analog-to-digital converter system. The system also includes somewhat unconventional ECL weighted current source digital-to-analog converters. The analog delay line comprised of the peristaltic charge-coupled-devices is clocked in exact synchronism with a digital delay line. Operation at conversion rates above 100 MHz are made possible.

3 Claims, 6 Drawing Figures

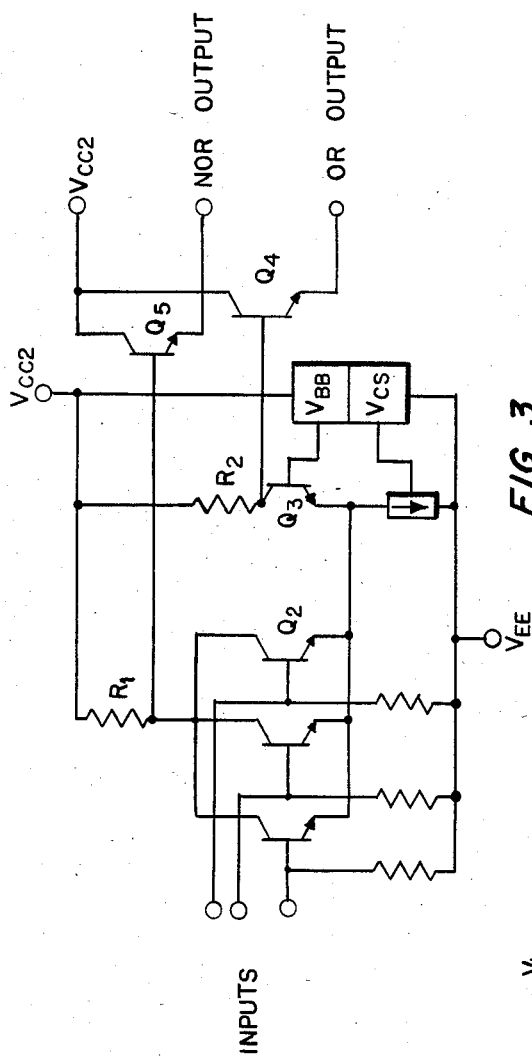
FIG. 3
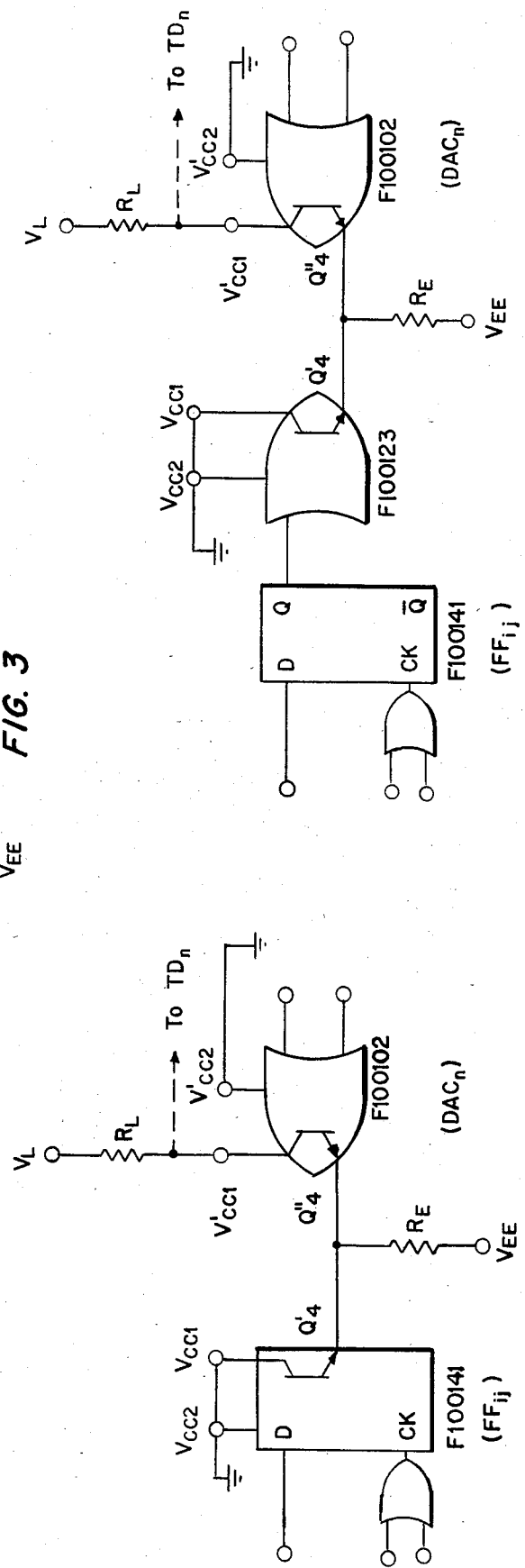
FIG. 4b
FIG. 4a

N-BIT PROPAGATARY ANALOG-TO-DIGITAL CONVERTER SYSTEM

The invention described herein may be manufactured and used by or for the Government of the United States of America for Governmental purposes without the payment of any royalties thereon or therefor.

BACKGROUND OF THE INVENTION

1. Field of the Invention

The present invention relates generally to analog-to-digital converters, but more particularly to a propagatory analog-to-digital converter which uses peristaltic charge-coupled-devices in the analog delay line portion thereof.

2. Description of the Prior Art

There has always been and will continue to be a need for ultra high speed analog-to-digital converters (hereinafter ADC's). In many technological areas, the speed of conversion and/or the resolution of ADC's have been major factors that have limited otherwise achievable overall system performance. For example, a prerequisite for obtaining enhanced radar performance is the inclusion of ultra high speed and high resolution ADC's. Consequently, there is a need in the prior art to configure an ADC having the foregoing qualities.

Many types of ADC's are available in the prior art. Generally speaking, they are classified as to type by the manner in which conversion takes place. The types that have been most successful are those that have been adapted to perform particular functions. An example is the dual-slope integrating ADC which is used almost exclusively in the digital voltmeter industry. The process of integrating up, then down, tends to cancel non-linearities and other errors introduced by the process.

The successive approximation ADC is the most popular by far of the many available types. It combines resolution, conversion speed, and cost in a way that satisfies many applications. Those applications requiring moderately high conversion rates would normally use a successive approximation ADC. It is lower in cost, more reliable in operation and consumes less power than other types with similar conversion rates.

Hence, there is a need in the prior art to configure an improved ADC that is not only, inter alia, ultra high in conversion rate, but flexible in its application to many fields of use like the foregoing, and fields of use such as telemetry, telecommunications, digital filtering and processing, spectrum analysis and other related fields of use.

One approach to ultra high speed analog-to-digital conversion is the n-bit propagatory ADC. An n-bit propagation ADC has n stages, each of which performs a simultaneous one-bit analog-to-digital conversion. The n stages are not identical, increasing in complexity with distance from the input. The reason for this is that each stage of the analog-to-digital conversion system has individual storage and digital-to-analog conversion, with the number of bits increasing by one from the $i-1$ to the $i^{th}$ stage. Its parallel binary output is an n-bit representation of the analog input signal that was present at the input n clock periods before.

While the foregoing approach to ultra high speed propagatory ADC's are known in the prior art, as far as is known, the implementation thereof has been unsuccessful due to the use of tapped inductive type delay lines as the analog delay line and other discrete components. Consequently, the systems in the prior art were bulky, and unreliable. Moreover, a basic problem was maintaining the timing and the fidelity of the analog signal while it progressed down a large and bulky analog delay line.

Thus, there is a need in the prior art to configure an ADC based on the concept of propagation and to use peristaltic charge-coupled-devices (hereinafter, PCCD's) in the analog delay line portion thereof thereby maintaining and in the general case increasing the conversion speed, and decreasing the size.

There is a related need in the prior art to the above need to use hybrid circuitry and/or very large scale integration (VLSI) techniques for the fabrication of the propagatory ADC according to the present invention.

As for as can be determined, no prior art n-bit propagatory ADC incorporates all of the improvements, features and advantages of the present invention.

OBJECTS OF THE INVENTION

Accordingly, an important object of the present invention is to configure an ADC system having low cost, high reliability, but yet have ultra high speed of conversion in an improved manner.

Another object of the present invention is to configure an improved ADC system that not only possesses ultra high speed of conversion, but is flexible in its application to many fields of technology, rather than be configured for a special use.

Yet another object of the present invention is to configure a n-bit propagatory ADC system in an improved manner.

A further object of the present invention is to configure an improved n-bit propagatory ADC system using PCCD's in the implemenation of the analog delay line portion thereof.

Still a further object of the present invention is to be able to fabricate the improved n-bit propagatory ADC system using hybridizing and/or VLSI techniques in an improved manner.

SUMMARY OF THE INVENTION

In accordance with the above stated objects, other objects, features and advantages, the present invention has as a primary purpose to configure an improved n-bit propagatory ADC system, which is the fastest, as far as is known, system while maintaining size, cost, reliability and flexibility integrity.

The essence of the present invention is in the use of PCCD's as the digitally clocked analog delay line, i.e., analog shift registers, and the use of the somewhat unconventional emitter-coupled-logic (hereinafter, ECL) weighted current source digital-to-analog converters (hereinafter, DAC's) as part of the system.

The purpose of the present invention is carried out by configuring the n-bit propagatory analog-to-digital converter system to include, in the case of an n-bit system, $n-1$ stages of an analog shift register serially connected, n threshold detectors operatively connected thereto, $n-1$ DAC's, operatively connected to the threshold detectors except for the first stage, $n-1$ digital shift registers similarly operatively connected to the threshold detectors and a multiple phase clock operatively connected to the analog shift registers and to the digital shift registers. As previously stated, the analog shift registers (analog delay line) comprise PCCD's.

An alternative version of the $n-1$ propagatory ADC uses multiple serially connected analog shift registers whereby each register is read out at the end of the particular delay line portion. This eliminates having to tap each analog shift register, thereby avoiding any interaction which could occur in the tapped serial case mentioned above. In this approach, the read-out process is independent.

BRIEF DESCRIPTION OF THE DRAWINGS

The previously stated objects, other objects, features and advantages of the present invention will be apparent from the following more particular description of the preferred embodiments as illustrated in the accompanying drawings, in which:

FIG. 3 is a circuit diagram of a typical emitter-coupled-logic (ECL) gate used in the implementation of the current source ADC's, in the embodiment of FIGS. 1a and 1b; and FIGS 4a and 4b are alternative schematic diagrams showing the connections of the ECL gate of FIG. 3 which are used in the DAC implementation of FIGS. 1a and 1b.

DESCRIPTION OF THE PREFERRED EMBODIMENTS

FIG. 1 shows an embodiment of an improved n-bit propagatory ADC 10 in which the present invention is employed, inter alia, to increase conversion speed. It includes an analog delay line 12 which further includes a plurality of analog shift registers $ASR_1$-$ASR_{n-1}$ serially connected as depicted. Analog data (not shown) is fed into analog shift register $ASR_1$ via signal input line 14. N-bit propagatory ADC 10 also includes a digital delay line 16 which further includes a plurality of digital shift registers $DSR_1$-$DSR_{n-1}$ connected in series-parallel as shown. Each digital shift register $DSR_1$-$DSR_{n-1}$ further includes a plurality of flip-flops $FF_1$-$FF_{n-1}$.

Still referring to FIG. 1, each conversion stage from (1) to (n) includes one of a plurality of threshold detectors 18, which comprise $TD_1$-$TD_n$ for an n-bit system. The plurality of threshold detectors 18 are each operatively connected at one input to analog delay line 12, aforementioned. A plurality of digital-to-analog converters 20, comprising different $DAC_1$-$DAC_{n-1}$ are operatively connected, as shown, to plurality of threshold detectors 18 and to digital delay line 16. A reference signal (not shown) is fed into threshold detector $TD_1$ of plurality of threshold detectors 18 and the plurality of digital-to-analog converters 20 via reference input line 22. One multiple phase output of a multiple phase clock 24 is connected to each analog shift register $ASR_1$-$ASR_{n-1}$ of analog delay line 12, and a single phase output thereof is connected to each digital shift register $DSR_1$-$DSR_{n-1}$ of digital delay line 16. This single phase output of multiple phase clock 24 drives the individual flip-flops $FF_1$-$FF_{n-1}$ of each digital shift register $DSR_1$-$DSR_{n-1}$ of digital delay line 16 as illustrated. Multiple phase clocks suitable for use with the present invention are well known and are used in MOS memory technology.

Figure 1A:
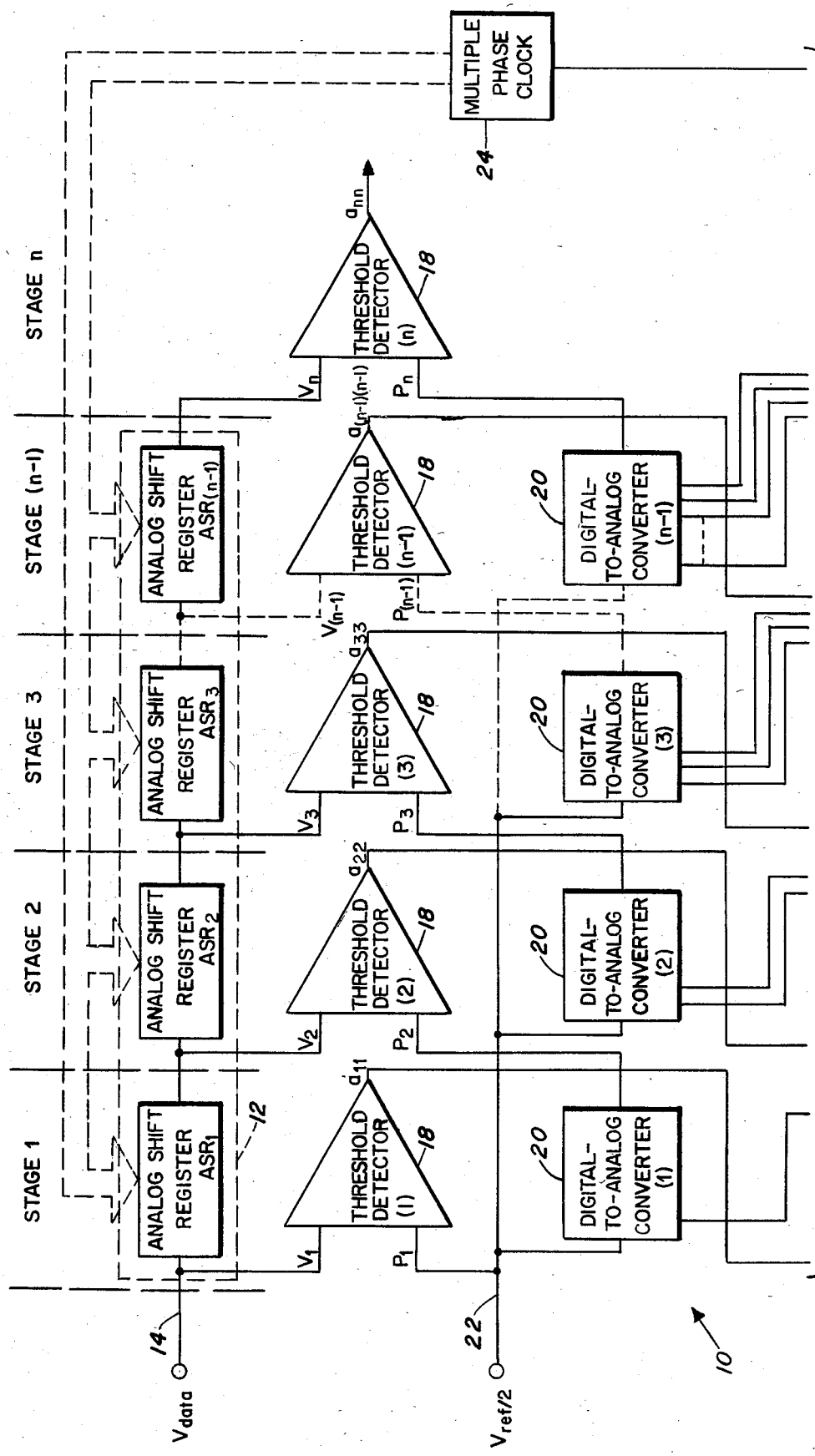
FIGS. 1a and 1b comprise a block diagram representation of an embodiment of the improved n-bit propagatory ADC, according to the present invention.
Figure 1B:
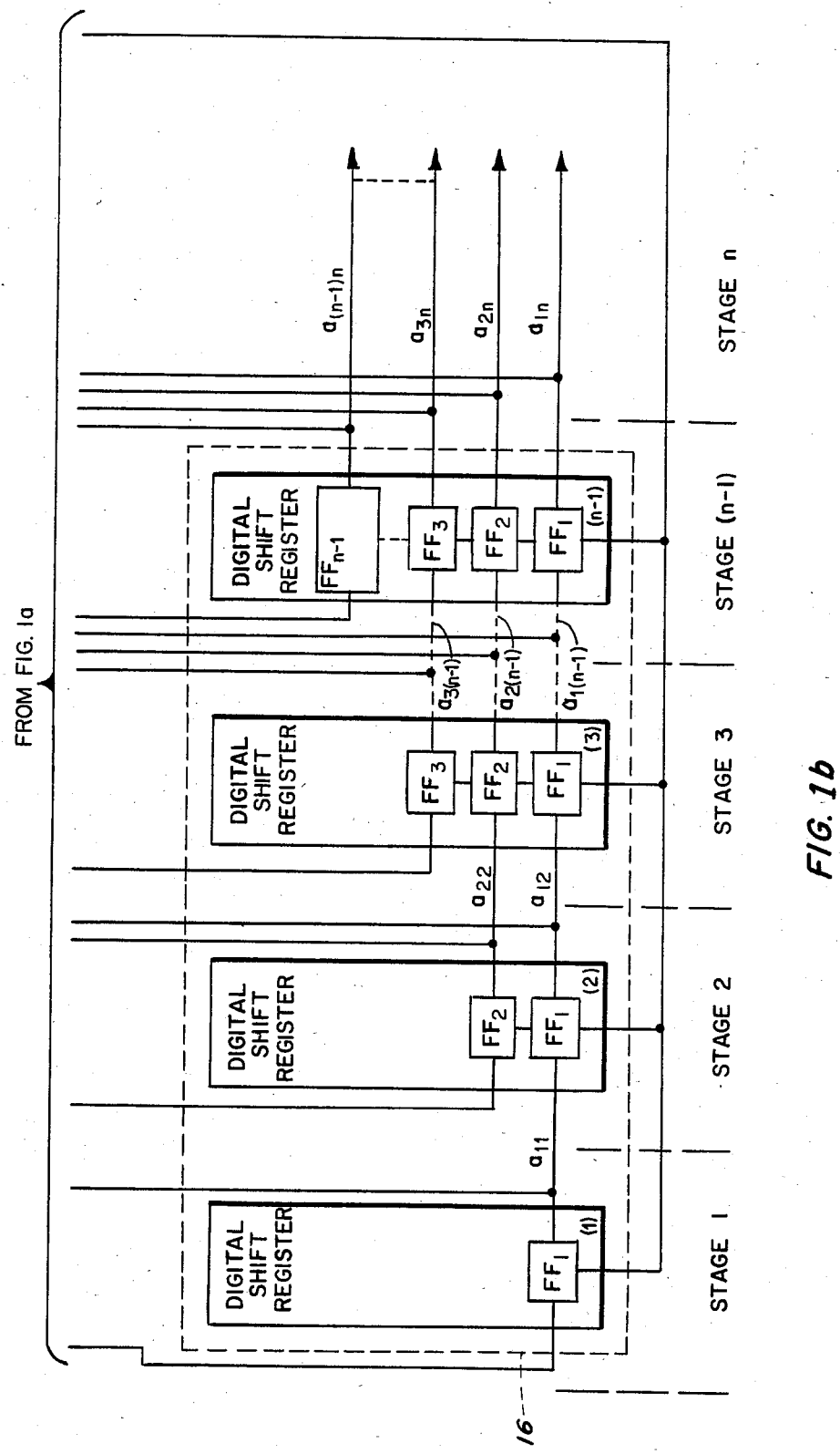
Figure 2:
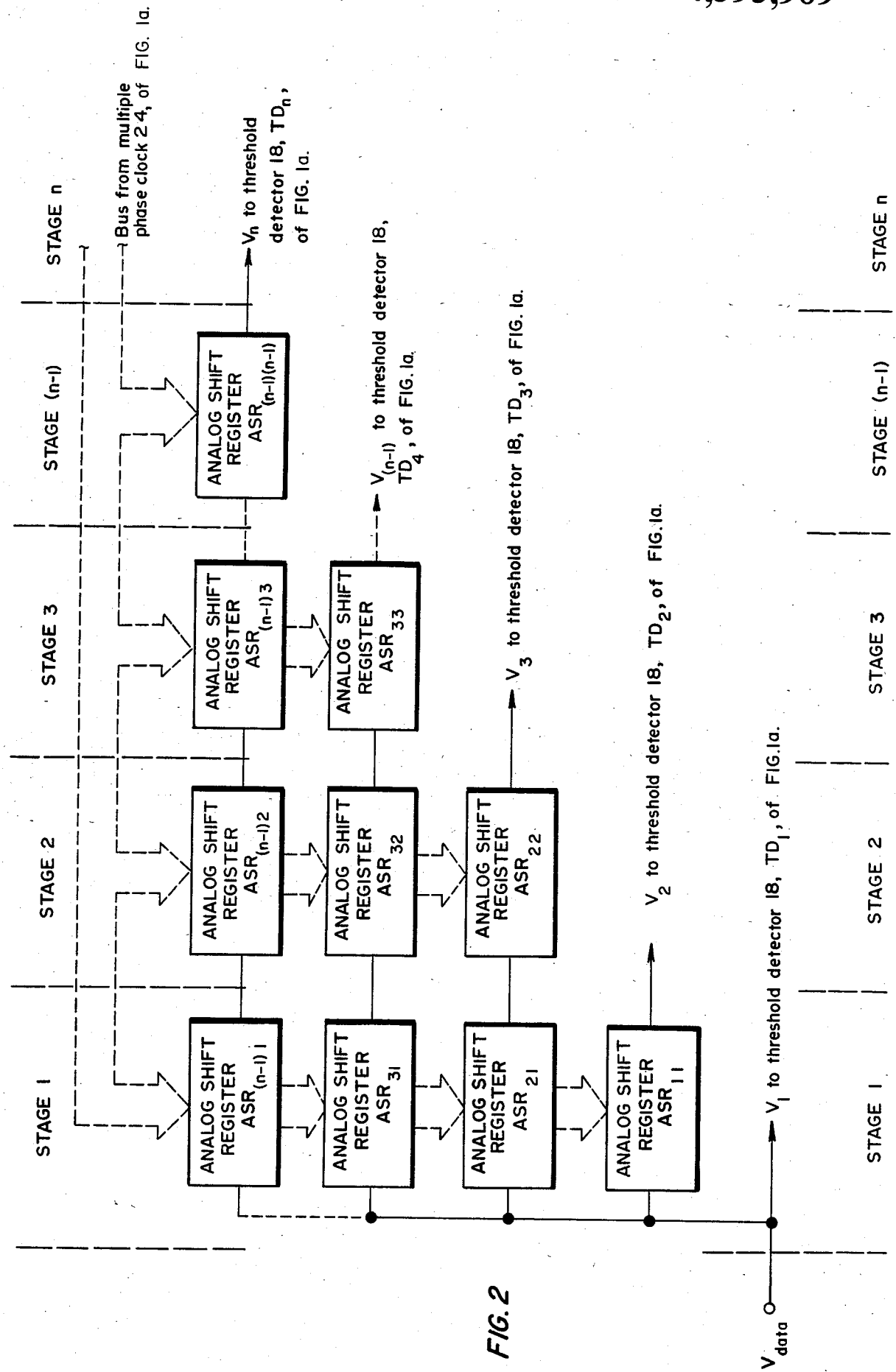
FIG. 2 a block diagram representation of another analog shift register suitable for use with the improved n-bit propagatory ADC of FIGS. 1a and 1b, according to the present invention.

FIG. 2 depicts another embodiment of an analog shift register suitable for use with the improved n-bit propagatory analog-to-digital converter 10 of FIGS. 1a and 1b. Instead of tapping analog delay line 12 at each analog shift register $ASR_1$-$ASR_{n-1}$, as shown in the embodiment of FIGS. 1a and 1b, multiple analog shift register $ASR_{ij}$ are used such that there are a plurality of different length parallel connected analog delay lines. The foregoing different length parallel connected analog delay lines each generate a single output voltage as shown. For example, the analog delay line for generating the voltage $V_n$ is n−1 analog shift registers $ASR_{ij}$ in length, while the analog delay line for generating the voltage $V_2$ is only one analog shift registers $ASR_{ij}$ in length. Thus, in this embodiment, stage 1 includes n analog shift registers $ASR_{ij}$, and stage n−1, for example, includes a single analog shift register $ASR_{i(n-1)}$, where i varies from 1 to n−1 corresponding to the levels of conversion. By using the foregoing series parallel approach, the readout process is made substantially independent thereby avoiding any interaction which could occur, in some applications, in the tapped serial embodiment of FIGS. 1a and 1b.

STATEMENT OF THE OPERATION

The operation of the present invention can best be understood by reference again to the block diagram representation of FIGS. 1a and 1b. As shown, in improved n-bit propagatory analog-to-digital converter 10, digital delay line 16 comprises n-1 digital shift registers (DSR's). They operate in synchronization with corresponding analog shift registers of analog delay line 12 such that each stage from one (1) to n adds one more bit to the conversion as the analog data, $V_{data}$, inputted at signal input line 14 propagates down analog delay line 12. At each clock period of multiple phase clock 24, all the analog data $V_i$ and all the digital data $a_{ij}$ is shifted one stage down analog delay line 12 and digital delay 16, respectively. During the first clock period, a sample of the analog data, $V_{data}$, is compared with the reference signal, $V_{ref/2}$, in threshold detector $TD_1$ to determine the most significant bit (MSB). At the beginning of the next clock period, the output signal $a_{11}$ of $TD_1$ is shifted into $FF_1$ of digital shift register $DSR_1$ of digital delay line 16, and the output voltage $V_2$ of analog shift register $ASR_1$ of analog delay line 12 is shifted into the second stage analog shift register $ASR_2$ thereof. The output signal $a_{11}$ of $FF_1$ of digital shift register $DSR_1$ is converted to an analog value by digital-to-analog converter $DAC_1$ of the plurality of digital-to-analog converters 20. The output voltage of digital-to-analog converter $DAC_1$ is $P_2 = V_{ref}/4 + a_{11} V_{ref}/2$. Threshold detector $TD_2$ compares the voltage $V_1$ with the voltage $p_2$ to obtain the second most significant bit. The output signals $a_{12}$ and $a_{22}$ of $FF_1$ and $FF_2$, respectively, of digital shift register $DSR_2$ of digital delay line 16 are converted by digital-to-analog converter $DAC_2$ to the value established by the two MSB's of stages one and two. The output voltage $P_3$ of digital-to-analog converter $DAC_2$ is $V_{ref}/8 + a_{22} V_{ref}/4 + a_{12} V_{ref}/2$. The operation continues in a similar manner during the remainder of the clock periods for a complete conversion.

Two elements are critical to the proper design and ultra high speed performance of the improved n-bit propagatory analog-to-digital converter, according to the present invention. They are analog delay line 12 and the plurality of digital-to-analog converters 20 as shown in FIGS. 1a and 1b.

For a number of reasons, current can be switched more rapidly than voltage. Consequently, a current source DAC, like that contemplated for the present invention, is faster than a voltage source DAC. In order to carry out the foregoing, emitter-coupled-logic (ECL) is contemplated. The Fairchild F100k series has a typical gate delay of 750 ps and is both power supply and temperature compensated. The basic Fairchild ECL gate is shown in FIG. 3.

Referring then to FIG. 3, $Q_2$ and $Q_3$ form a current switch. The logic state is the resultant voltage drop across resistor $R_1$ or resistor $R_2$. Emitter followers $Q_4$ and $Q_5$ are added as shown. Only the OR output at the emitter of $Q_4$ is used in the present invention. The collectors of the emitter followers are returned to a separate power supply terminal $V_{CC1}$ which ensures that any changes in load curents during switching do not cause spiking at power supply terminal $V_{CC2}$ within the ECL gate package.

Still referring to FIG. 3, the fact that the collector and emitter of, for example, $Q_4$ is available to a user coupled with the fact that the collector capacitance is very small ($<1$ pf) are put to advantage in configuring the improved n-bit propagatory analog-to-digital converter, according to the present invention.

Still referring to the ECL gate circuit of FIG. 3 and concurrently with the circuit diagram of FIG. 4a, two different ECL gate outputs, for example, $Q'_4$ and $Q''_4$, of two ECL gates, are connected at their emitters via $R_E$ to voltage supply terminal $V_{EE}$ to form a single binary current source controlled by the D input of flip-flop $FF_{ij}$. However, to ensure that one of two transistors in FIG. 4a is always off, the $V'_{CC1}$ terminal of $Q''_4$ is offset from the $V'_{CC2}$ terminal. Thus, for purposes of the invention, $V'_{CC2}$ is zero (0) volt and $V'_{CC1} = V'_{CC2} + 0.375$ volt.

Another way to ensure that $Q'_4$ is OFF when $Q''_4$ is ON is to use the F100123 OR gate as the driver. The circuit is shown in FIG. 4b. The F100123 OR gate was developed for bus driving. It is similar to the "tri-state" bus drivers of TTL in that its output emitter-follower is turned off when the gate intput is a logic "0" and it is wire-OR'ed to a bus. The base of the output transistor is carried to about the logic "0" level to assure that the device will be turned off when the output of another gate is at logic "0". (Remember that in the wire OR connection, the output is the higher of the two values that could exist were they are not joined).

An n-bit $DAC_n$ can be constructed by connecting n emitter-coupled states of FIG. 4a or FIG. 4b at the collectors of the $Q''_4$ devices and summing with $R_L$ as shown. The capacitance at the collector of each output transistor $Q''_4$ is about 0.8 pf. Thus, the time constant is small, even for large n. For example, a voltage swing of 5 volts with an MSB current of 25 milliamperes would require a $R_L$ of 100 ohms. The time constant (RC) for n equals seven would be about $(10^2)(10^{-11}) = 10^{-9}$ sec. The output would settle to with 0.01% of its final value in 9.2 nanoseconds.

Besides the advantage of speed, a DAC configured according to the present invention has the additional advantage that it can be constructed from the same logic as digital delay line 16.

Referring again to FIGS. 1a and 1b, a charge coupled device (CCD) is employed as the operative device in analog delay line 12. In the analog shift registers $ASR_1$–$ASR_{n-1}$ thereof, the CCD's are clocked in exact synchronism with the flip-flops $FF_{ij}$ of digital shift registers $DSR_1$–$DSR_{n-1}$ of digital delay 16. Unlike an inductive delay line, an analog delay line 12 configured with CCD's can be clocked at any desired conversion rate (up to the limitation of the devices), CCD transfer efficiencies of 0.9998 to 0.9999 have been achieved.

Two fundamental types of CCD's are produced in the laboratories today. The first type (surface channel) is one in which the charges move directly at the surface of the silicon and silicon-dioxide insulating layer. The second type (buried channel or peristaltic) is one in which the charge is moved without coming in contact with the oxide-silicon (or GaAs) interface. Only the second type is of interest here. Surface channel CCD's are limited to speeds in the 10 MHz range. However, development of the peristaltic CCD circumvented the speed limitation. Operation at rates above 100 MHz are made possible by this technique.

Associated with getting a PCCD to propagate a given amount of charge with sufficient accuracy to be useful for this application is the problem of getting the signal into and out of the device. A current amplifier such as an emitter-follower, a Darlington amplifier, or complementary amplifier can be used to get the signal into the device. The signal can be gotten out of the device by: (a) a direct conversion (across a resistor); (b) a floating-gate (induced voltage in output FET gate from charges in the channel beneath the floating gate); (c) a source or emitter follower or compound follower using either of the above or a combination of the two; and (d) a differential output circuit common mode rejection for the bias voltages and the clock driving signal).

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An improved n-bit propagatory analog-to-digital converter system having n stages for converting an analog data into a parallel binary output number, which comprises:

a plurality of analog shift registers $ASR_1$–$ASR_{n-1}$, arranged in a predetermined manner so as to comprise an analog delay line, and wherein each of said plurality of analog shift registers includes a peristaltic charge-coupled-device;

a plurality of digital shift registers $DSR_1$–$DSR_{n-1}$, arranged in a predetermined manner so as to comprise a digital delay line, and wherein each of said plurality of digital shift registers includes a flip-flop for the first stage of said improved n-bit propagatory analog-to-digital converter, two flip-flops for the second stage, three flip-flops for the third stage up to n−1 stages;

a plurality of threshold detectors $TD_1$–$TD_n$, each operatively connected at one of its inputs to said analog delay line in each of the stages 1 through n;

a plurality of digital-to-analog converters $DAC_1$–$DAC_{n-1}$, operatively connected to the other inputs of corresponding ones of said threshold detectors, to said digital shift registers and to each other, $DAC_1$ being a 1-bit current source DAC and connected in stage 2, $DAC_2$ being a 2-bit current source DAC and connected in stage 3, $DAC_3$ being a 3-bit current DAC source and connected in stage 4, . . . up to the $n^{th}$ stage; and a multiple phase clock having a series of outputs operatively connected to said analog delay line and another output operatively connected to said digital delay line such that they operate in synchronization, and such that each stage from (1) to n of said n-bit propagatory analog-to-digital converter adds one more bit to the conversion as the analog data, inputted at the input of analog shift register $ASR_1$, propagates down said analog delay line, and is compared to a reference signal for each of the stages.

2. The n-bit propagatory analog-to-digital converter system of claim 1 wherein the predetermined manner in which said analog shift register $ASR_1-ASR_{n-1}$ are arranged is serially.

3. The n-bit propagatory analog-to-digital converter system of claim 1 wherein the predetermined manner in which said analog shift registers are arrange to comprise an analog delay line is in a series-parallel fashion so as to include n analog shift registers $ASR_{i1}$ in stage 1, $n-2$ analog shift registers $ASR_{i2}$ in stage 2, ... and a single analog shift register $ASR_{i(n-1)}$ in stage $n-1$, where i varies from 1 to $n-1$ corresponding to the levels of conversion.

* * * * *